United States Patent
Alavi et al.

(10) Patent No.: US 10,372,382 B2
(45) Date of Patent: Aug. 6, 2019

(54) METHODS AND APPARATUS FOR READ DISTURB DETECTION BASED ON LOGICAL DOMAIN

(71) Applicant: Western Digital Technologies, Inc., Irvine, CA (US)

(72) Inventors: Parvaneh Alavi, Lake Forest, CA (US); Hung-min Chang, Irvine, CA (US); Haining Liu, Irvine, CA (US); Jerry Lo, Hacienda Heights, CA (US); Hung-Cheng Yeh, Irvine, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 191 days.

(21) Appl. No.: 15/394,560

(22) Filed: Dec. 29, 2016

(65) Prior Publication Data
US 2018/0188981 A1    Jul. 5, 2018

(51) Int. Cl.
| | | |
|---|---|---|
| G06F 11/00 | (2006.01) | |
| G06F 3/06 | (2006.01) | |
| G11C 16/34 | (2006.01) | |
| G11C 16/04 | (2006.01) | |
| G11C 16/08 | (2006.01) | |
| G11C 16/26 | (2006.01) | |

(52) U.S. Cl.
CPC .......... *G06F 3/0679* (2013.01); *G06F 3/064* (2013.01); *G06F 3/0616* (2013.01); *G06F 11/004* (2013.01); *G11C 16/0483* (2013.01); *G11C 16/08* (2013.01); *G11C 16/26* (2013.01); *G11C 16/349* (2013.01); *G11C 16/3418* (2013.01); *G11C 16/3427* (2013.01); *G11C 16/3431* (2013.01); *G06F 2201/81* (2013.01); *G06F 2201/88* (2013.01)

(58) Field of Classification Search
CPC . G06F 11/0754; G06F 11/0757; G06F 11/076
USPC ........................................ 714/47.2
See application file for complete search history.

(56) References Cited

U.S. PATENT DOCUMENTS

| | | | | |
|---|---|---|---|---|
| 8,949,555 | B1* | 2/2015 | Karamcheti | G06F 13/4282 711/158 |
| 2011/0238694 | A1* | 9/2011 | Carlsson | G06F 17/30625 707/769 |
| 2014/0215103 | A1* | 7/2014 | Cohen | G06F 13/28 710/23 |
| 2017/0277471 | A1* | 9/2017 | Huang | G06F 3/0619 |

* cited by examiner

*Primary Examiner* — Sarai E Butler
(74) *Attorney, Agent, or Firm* — Loza & Loza, LLP; Gabriel Fitch (57) ABSTRACT

Aspects of the disclosure provide methods and apparatus that monitor and mitigate Read Disturb errors in non-volatile memory (NVM) devices such as NAND flash memories. The disclosed methods and apparatus determine which logical block addresses (LBAs) in the NVM device are frequently accessed by a host, rather than looking a physical address accesses. The potential Read Disturb errors may then be mitigated by triggering Read Disturb mitigation when the numbers of access of one or more of the frequently accessed LBAs exceeds a predefined number of accesses.

21 Claims, 8 Drawing Sheets

METHODS AND APPARATUS FOR READ DISTURB DETECTION BASED ON LOGICAL DOMAIN

FIELD

The present disclosure relates generally to solid state drives (SSDs), and more specifically, to methods and apparatus for Read Disturb detection based on logical domain.

BACKGROUND

In a variety of consumer electronics, solid state drives (SSDs) incorporating non-volatile memories (NVMs) are frequently replacing or supplementing conventional rotating hard disk drives for mass storage. These non-volatile memories may include one or more flash memory devices, such as NAND flash memories, and the flash memory devices may be logically divided into blocks with each of the blocks further logically divided into addressable pages. These addressable pages may be any of a variety of sizes (e.g., 512 Bytes, 1 Kilobytes, 2 Kilobytes, 4 Kilobytes), which may or may not match the logical block address sizes used by a host computing device.

When cells or pages in a block are read from an NVM, the process of reading a page may have a detrimental effect on other pages in the block. The method used to read flash memory can cause surrounding pages in the same memory block to change over time (i.e., become programmed). The read page does not fail, but instead the surrounding pages may fail on a subsequent read. This phenomenon is known as the Read Disturb effect. Read Disturb induced errors typically occur when a wordline (WL) of a NVM is read substantially more frequently than other wordlines on the same block. In particular, the immediately adjacent wordlines are the most prone to errors and show large numbers of errors after enough Read Disturb activity has occurred. The Read Disturb errors can cause possible data loss if the errors are too numerous to correct with error-correcting codes (ECCs).

In order to mitigate Read Disturb errors, known methods track the issue directly by keeping page read counts for every single page. Thus, when a certain threshold for page counts of a particular page is reached, the data of the block can then be relocated in the NVM, and then the original block released to the block pool. The threshold number of reads is generally in the hundreds of thousands of reads between intervening erase operations. More complex solutions may include using sets of criteria to determine when relocate the data, which usually involve the relationship of adjacent page read counts.

Further ways of mitigating Read Disturb include consolidating the data from pages to blocks to reduce the memory footprint. By putting a read threshold on the block, rather than on each page, the block can be conservatively relocated earlier than the failing point. Yet another method is to examine every host read's flash location and then read the surrounding pages to check those pages for higher bit errors. When higher error ratios of surrounding pages occur, the block will then be relocated.

SUMMARY

According to an aspect, a method of monitoring a non-volatile memory (NVM) for potential Read Disturb errors is disclosed. The method includes maintaining a data structure of a plurality of logical block addresses of the NVM read accessed by a host, where the data structure further includes read access counts for each of the logical block addresses of the plurality of logical block addresses maintained in the data structure. Additionally, the method includes comparing the read access counts to a predefined threshold number of access counts to determine whether to trigger Read Disturb mitigation for physical memory address locations in the NVM corresponding to logical block address.

According to another aspect, a solid state drive (SSD) is disclosed. The SSD includes a non-volatile memory (NVM) and a controller communicatively coupled to a host device, a local memory device, and the NVM. The controller is configured to store read access counts in the local memory device, where the read access counts correspond to logical block addresses in the NVM that are read accessed by the host device. Additionally, the controller is configured to determine when one or more of the stored read access counts exceed a predefined threshold number of access counts.

According to yet another aspect, an apparatus for mitigating Read Disturb errors in a non-volatile memory (NVM) is disclosed. The apparatus includes means for determining which logical block addresses (LBAs) in the NVM are frequently accessed by a host. Further, the apparatus also includes means for triggering a Read Disturb prevention process when one or more of the frequently accessed LBAs exceed a predefined number of accesses.

DETAILED DESCRIPTION

The present disclosure provides methods and apparatus for mitigating Read Disturb errors in an SSD including a non-volatile memory (NVM). In particular, the present disclosure is based on a recognition that known methodologies for mitigating Read Disturb errors are prone to result in very large write amplification (i.e., an undesirable phenomenon where the actual amount of physical information written is a multiple of the logical amount intended to be written, where write amplification is typically measured by the ratio of writes committed to the flash memory to the writes coming from the host system). As NVM memories have evolved in terms of capacity and structure, the write amplification is compounded because pages have become bigger and the number of pages per block has increased resulting in larger blocks. Typically, the ratio for write amplification is 1024 to 1 for the current generation of NVM flash memory (assuming 4 KB mapping), and this is increasing. This is a costly use of the NVM memory space. Thus, the presently disclosed methods and apparatus provide a reduction in the write amplification and the NVM memory space used for Read Disturb error mitigation.

In particular, the disclosed methods and apparatus for mitigating Read Disturb errors in an SSD including a non-volatile memory (NVM) based on further considering host access patterns, such as looking at logical block addresses (LBAs) accessed in memory, whereas conventional methods simply consider physical block locations. In particular, a host reads particular LBAs substantially more often than others addresses, which causes Read Disturb errors to occur. Accordingly, the present disclosure provides for the additional examination of the LBA domain that affects the NVM, which is read disturbed at the physical level by the logical activity of the host when performing reads to the NVM. As will be described herein, detection of the Read Disturb may include keeping track of host access patterns such as read counts for each LBA or group of LBAs. This mechanism provides a means of detecting which LBAs are accessed more often, where these LBAs will cause Read Disturbs at the physical level. In addition, mitigation of the Read Disturbs may be accomplished by further directing or funneling all highly accessed LBAs into a same NAND physical block or group of blocks, which affords an advantage of reducing write amplifications because the relocation of substantially fewer blocks will occur. Moreover, by focusing on those LBAs that are accessed more often, a further advantage is realized of resetting the effects of Read Disturbs with fewer events for highly commonly accessed LBAs.

Referring to the drawings, apparatus and methods for triggering a Read Disturb protocol is illustrated, where the protocol is the process of determining potential detrimental Read Disturb errors in a block and then relocating the block in the NVM. In contrast to related art the presently disclosed methods and apparatus described herein that consider logical block addresses (LBAs) helps ensure that the Read Disturb detection is performed on the host access pattern and that preventative measures are taken. Furthermore, the write amplification will be significantly reduced.

Figure 1:
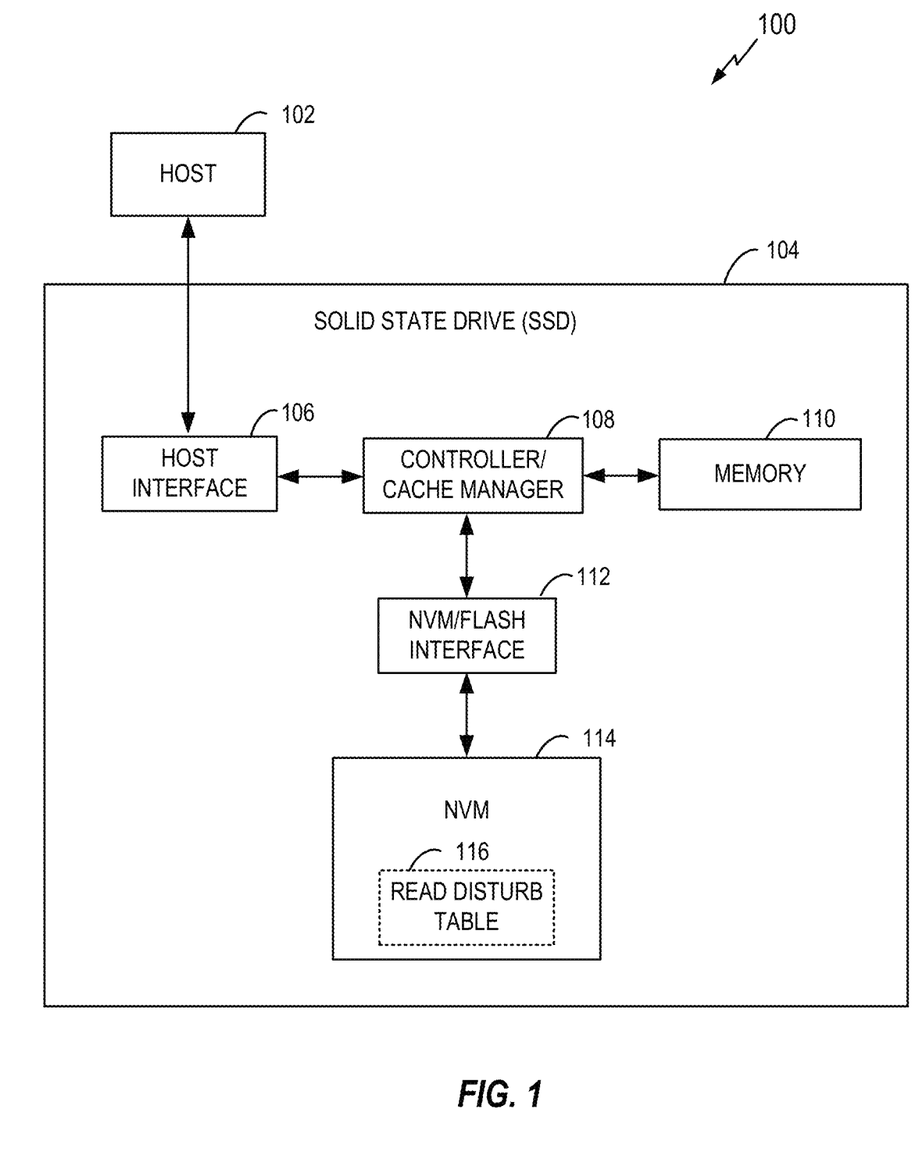
FIG. 1 is a block diagram of an exemplary solid state device (SSD) in which detection of potential Read Disturb errors and triggering of block relocation may be performed in accordance with embodiments of the present disclosure.

FIG. 1 is a block diagram of a system 100 including an exemplary solid state device (SSD) in which the disclosed detection and relocation of Read Disturb blocks may be implemented in accordance with aspects of the disclosure. The system 100 includes a host 102 and a SSD storage device 104 coupled to the host 102. The host 102 provides commands to the SSD storage device 104 for transferring data between the host 102 and the SSD storage device 104. For example, the host 102 may provide a write command to the SSD storage device 104 for writing data to the SSD storage device 104 or read command to the SSD storage device 104 for reading data from the SSD storage device 104. The host 102 may be any system or device having a need for data storage or retrieval and a compatible interface for communicating with the SSD storage device 104. For example, the host 102 may a computing device, a personal computer, a portable computer, a workstation, a server, a personal digital assistant, a digital camera, or a digital phone as merely a few examples.

The SSD storage device 104 includes a host interface 106, a controller or cache manager (CM) 108, a memory 110, a non-volatile memory (NVM) interface 112 (which may also be referred to as a Flash memory interface), and a non-volatile memory (NVM) 114, such as a NAND Flash memory for example. The host interface 106 is coupled to the controller 108 and facilitates communication between the host 102 and the controller 108. Additionally, the controller 108 is coupled to the memory 110 and the NVM 114 through the NVM interface 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host 102 includes the SSD storage device 104. In other embodiments, the SSD storage device 104 is remote with respect to the host 102 or is contained in a remote computing system communicatively coupled with the host 102. For example, the host 102 may communicate with the SSD storage device 104 through a wireless communication link.

The controller 108 controls operation of the SSD storage device 104. In various aspects, the controller 108 receives commands from the host 102 through the host interface 106 and performs the commands to transfer data between the host 102 and the NVM 114. Additionally, the controller 108 may manage a Read Disturb table (e.g., 116 as shown in FIG. 1) that is used to keep track of blocks and/or pages that have been read. Furthermore, the controller 108 may manage reading from and writing to memory 110 for performing the various functions effected by the controller and to maintain and manage cached information stored in memory 110.

The controller 108 may include any type of processing device, such as a microprocessor, a microcontroller, an embedded controller, a logic circuit, software, firmware, or the like, for controlling operation of the SSD storage device 104. In some aspects, some or all of the functions described herein as being performed by the controller 108 may instead be performed by another element of the SSD storage device 104. For example, the SSD storage device 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The memory 110 may be any memory, computing device, or system capable of storing data. For example, the memory 110 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the controller 108 uses the memory 110, or a portion thereof, to store data during the transfer of data between the host 102 and the NVM 114. For example, the memory 110 or a portion of the memory 110 may be a cache memory.

The NVM 114 receives data from the controller 108 via the NVM interface 112 and stores the data. The NVM 114 may be any type of non-volatile memory, such as a flash storage system, a solid state drive, a flash memory card, a secure digital (SD) card, a universal serial bus (USB) memory device, a CompactFlash card, a SmartMedia device, a flash storage array, or the like.

In the example of FIG. 1, read requests will generally comprise a request from the host 102 via the interface 106 to read the data within a given logical Page address associated with the NVM 114. Each logical Page address is associated with a specific physical address within the NVM 114 through the use of a table maintained by the system controller 108. In general, the table maps each logical Page address to a physical Page address within the NVM 114. The use of logical Page addresses and a logical-to-physical Page address conversion allows the controller 108 to effectively manage the memory within the NVM 114 and to implement various mapping and detection mechanisms, including the disclosed mechanism for detecting Read Disturb errors.

Figure 2:
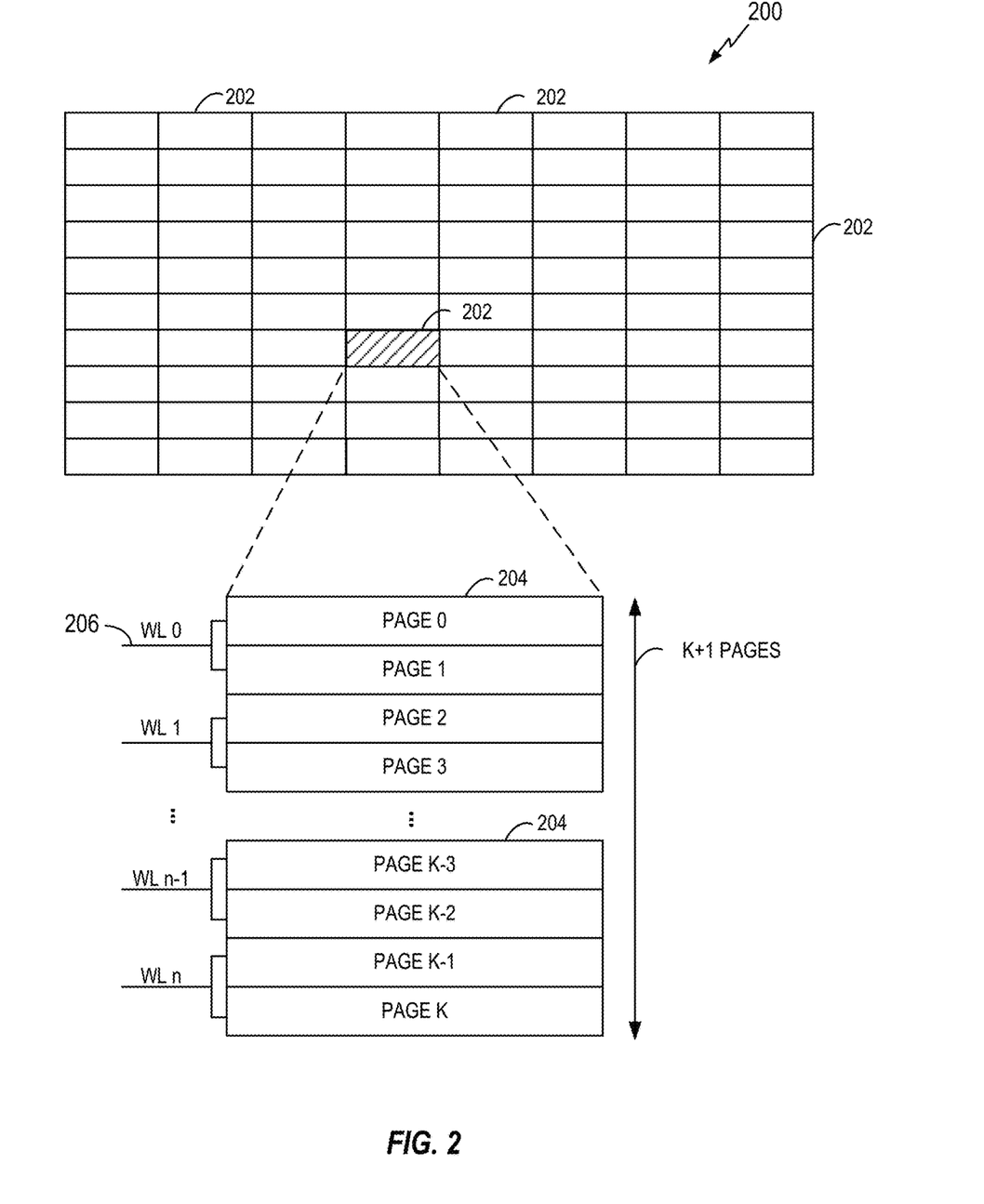
FIG. 2 is a diagram illustrating an exemplary flash memory array organization.

FIG. 2 is a block diagram illustrating an exemplary flash memory organization. A flash memory array structure 200 may include a number of memory blocks 202 (hereinafter "blocks" in this disclosure). Each block 202 may include a number of pages 204 (e.g., K+1 pages in each block as shown in FIG. 2). Access to the pages 204 may be controlled via a number of wordlines 206 (e.g., WL0 through WLn shown in FIG. 2). In one example, one wordline (WL) can control the access of a single page. In another example illustrated in FIG. 2, one wordline (WL) can control the access of two pages (i.e. an upper page and a lower page). In other examples, one wordline may control the access to more than two pages. While FIG. 2 illustrates an exemplary memory organization of the flash memory 200, the present disclosure is not limited to this particular example. In other examples, the flash memory 200 may have other memory organizations. The flash memory 200 may be included in the NVM 114 of the SSD 104.

Figure 3:
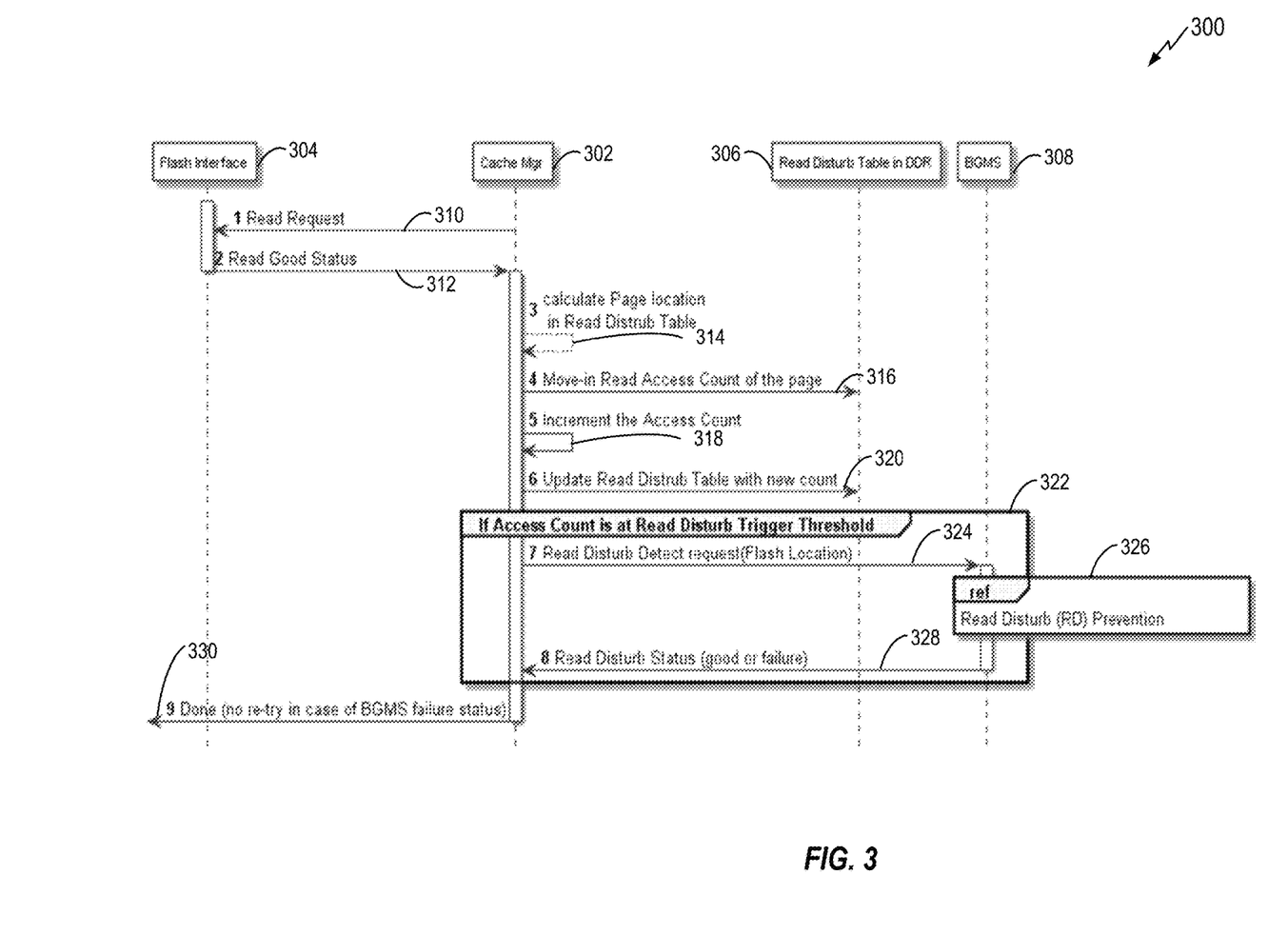
FIG. 3 illustrates an example of a flow diagram of a Read Disturb triggering process according to an aspect of the present disclosure.

FIG. 3 illustrates a flow diagram 300 of a Read Disturb triggering process according to an aspect of the present disclosure. Diagram 300 illustrates messaging/signaling between a cache manager (CM) 302 (e.g., controller 108), a flash memory interface 304 (e.g., interface 112), a Read Disturb Table 306, and a process 308 for effecting handling of a determination of Read Disturb, which includes preventing read disturb errors and/or relocating pages or blocks to avoid read disturb errors (e.g., a background media scan (BGMS) process or module, which scans adjacent pages for read disturb prevention). It is noted here that in the case of a particular embodiment using a BGMS module, adjacent pages to a page causing Read Disturb may be different for different NAND geometries based on the wordline placement inside each specific geometry of NAND. In a SanDisk 15 nm NAND, for example, the adjacent pages/wordlines are within 6 pages of the originating page and vary depending on the actual page number. It is noted that the Read Disturb Table may be stored in memory 110 of FIG. 1, but also could be stored in the NVM 114 as an alternative.

Figure 4:
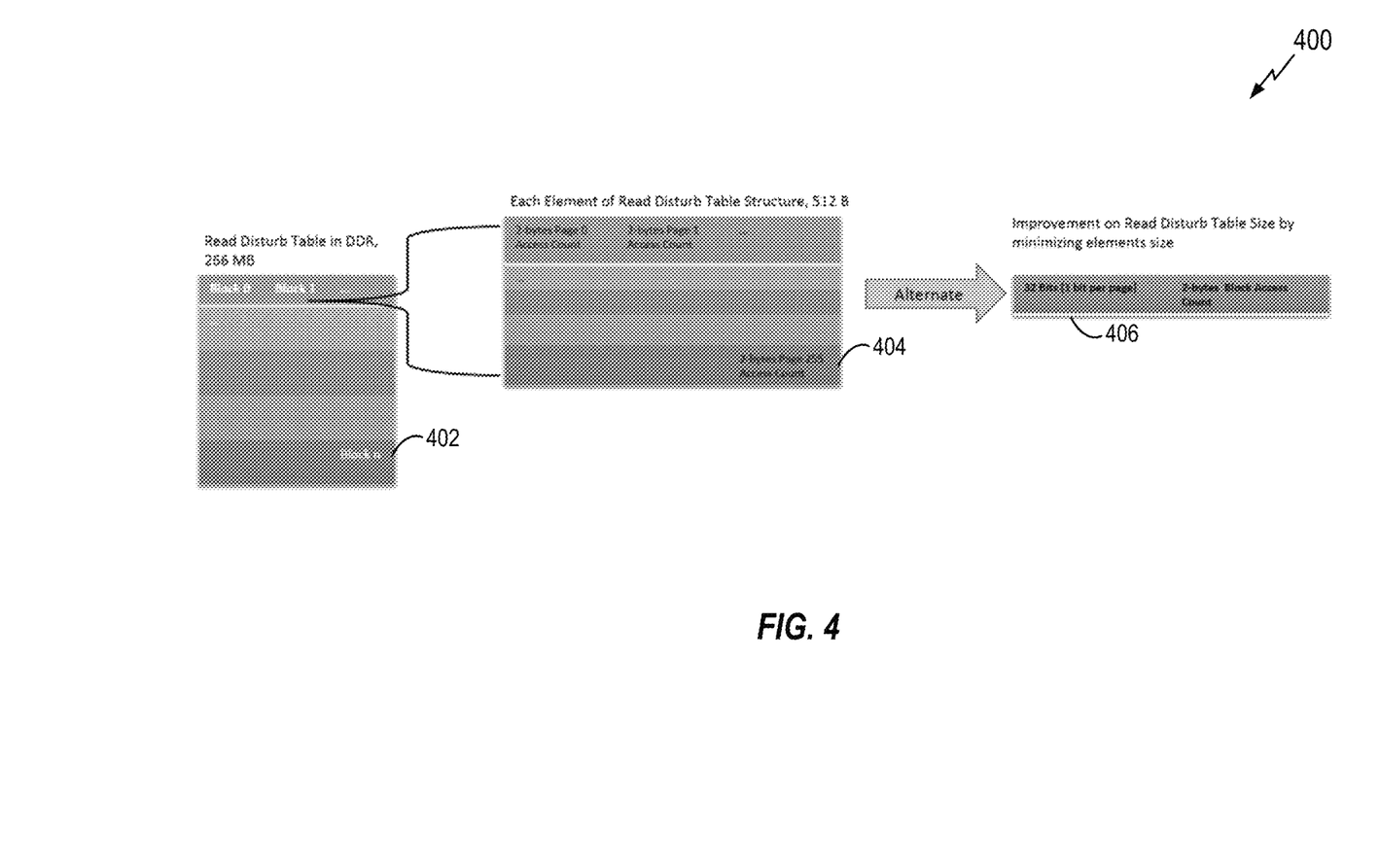
FIG. 4 is a diagram illustrating one example of a Read Disturb Table format that may be utilized in the presently disclosed methods and apparatus.

FIG. 4 illustrates one example of a Read Disturb Table format 400 that may be utilized in the presently disclosed methods and apparatus. As shown, the Read Disturb Table 402 may include entries for block 0 through block n for an "n" number of blocks in the flash memory (e.g., NVM 114). Within each block entry, the table further includes access count numbers for each page in the block as shown at 404. In one example, the number of pages may be 256 per block, and each count entry uses 2 bytes to store the information for a total of 512 bytes used for storing the page access counts for each block in the Read Disturb Table. Thus, for example, if an 8 Terabyte (TB) SSD is assumed, the maximum number of block for this sized memory would be 4252×4 plane×32 blockset=544256 blocks. Thus, the size of the Read Disturb Table would be equal to 544256×256 pages×2 bytes=266 MB.

FIG. 4 also illustrates that an alternative 406 to the structure of 404 may be used to minimize the elements size and, thereby reduce the storage space needed for the Read Disturb Structure. In a particular example, the alternative structure 406 may instead utilize 32 Bits, with one bit per page, as well as 2 bytes to store the access count for the block, rather than for each page.

Turning back to FIG. 3, when a host initiates a read request via the CM 302, request signaling is sent to the flash interface 304 as shown at 310 to access the NVM (e.g., NVM 114 in FIG. 1). If the data read from the NVM 114 is good, a read good status message 312 is sent from the interface 304 to the CM 302. A location of the accessed page in the Read Disturb table may be calculated or determined by the CM 302 as shown at reference number 314. Based on the determined location, the CM 302 signals move-in Read Access count of the page as indicated by message 316. An access count for the page is then incremented by the CM 302 as indicated at 318. Additionally, the CM 302 effectuates an update of the Read Disturb Table with a new count as shown at 320. It is noted here that the move-in operation is a double data rate (DDR) read access operation. In particular aspects, this DDR read access is a request made by firmware to hardware to read data from DDR into the local SRAM. The Access Count being moved in is a counter from a list of counters that map the entire logical domain space. The list can be described as an array or tree. The originating host read request maps or calculates to a specific item inside the list.

The CM 302 may keep track of or determine when the access count stored in the Read Disturb Table 306 reaches a predefined threshold, which indicates the likelihood of Read Disturb errors occurring due to a particular number of page accesses as indicated with block 322. It is noted that this triggering process in block 322 may be initiated when any page access count for a particular page reaches the predefined threshold count value. In an alternative, this process may be triggered when a block access count has reached a predefined threshold. In either case, when the relevant threshold has been detected, the CM 302 issues a Read Disturb Detect request 324 to the read disturb process 326 effected by BGMS or some other methodology for mitigating Read Disturb effects. It is noted here that the process 326 may be implemented by the CM 302, the controller 108, or some other processing circuitry. The process 326 then provides the CM 302 with a Read Disturb Status indicating either a good read status or a read failure for those potentially affected nearby pages (or blocks) as indicated by message 328. The completion of the process is communicated to the interface 304 by the CM 302 as indicated by message 330, whether the status was good or a failure. In the case of a failure, in an aspect the processes of FIG. 3 are not repeated in the case of the failure of the Read Disturb prevention 326.

As may be appreciated by those skilled in the art, the size of the Read Disturb Table in FIG. 4 may be fairly large will use significant memory space (i.e., assuming without the alternative structure 406 described above and discussed below in more detail). Accordingly, in further aspects, the number of pages per block may be decreased in the Read Disturb Table by changing the number of page locations from 256 to a smaller number such as 10, for example. Thus, each element in the Read Disturb table would need one additional byte to keep track of the page number. In such cased, the CM 302 would require searching through list of X pages, (i.e., X move-in and 1 move out).

According to another aspect, which was mentioned before in connection with alternative 406 in FIG. 4, the structure of the Read Disturb table could be modified to reduce the size of the Read Disturb table by keeping one bit per page in each block and only one counter per Block. In an example, the bit having a value of '0' would mean that the page has not been accessed, whereas a value of "1" would indicate that the block has been accessed. When the 2 byte block access counter value reaches the predefined trigger threshold, then the Read Disturb detection request (e.g. 324 in FIG. 3) would be sent for each accessed page to the Read Disturb Prevention mechanism 326 (e.g., the BGMS manager 308). In this example, the Read Disturb Table size could be reduced from 266 MB to 18 MB (i.e., Read Disturb Table size=544256*((256 pages/8 bits)+2 bytes)=18 MB).

Furthermore, it is noted that the processes of FIG. 3 as described above are not specifically accounting for host pattern detection or LBA accesses by a host. Thus, according to yet a further aspect, the host pattern or LBA accesses by a host may be accounted for to more accurately determine the causative factor for Read Disturb errors based on those LBAs that are frequently read by the host. According to an aspect, a Data Manager (DM) may be utilized to trigger the Read Disturb Request and update the Read Disturb table and trigger Read Disturb Detection by the read Disturb prevention mechanism 326 (e.g., a BGMS manager). Thus, the CM may then send back an additional field (e.g., a flash location) in response to a read logical block number (LBN) from the Data manager, where an LBN is composed of multiple LBAs.

According to yet another aspect of implementing host pattern detection, local memory in a CM, such as CM 108 may be used to store a history of accessed flash locations plus the access counter of the locations. As one example of how this may be implemented, various functionalities or structures may be added to data structures discussed above in connection with the examples of FIGS. 3 and 4. In particular, a pool of flash location elements in local memory may be added. Furthermore, a data structure, such as a tree structure of accessed Flash Locations built during Read I/Os from a host may be formed. Still further, a list of low-accessed flash locations (e.g., 1<Flash location access count<100) may be determined and stored based on the Access Count. In the context of a data structure such as a tree, an index of the lowest access counter item that could be included in the tree is when the number of accesses is greater than a threshold, such as 100 as an example, but the structure is not limited to such.

Figure 5:
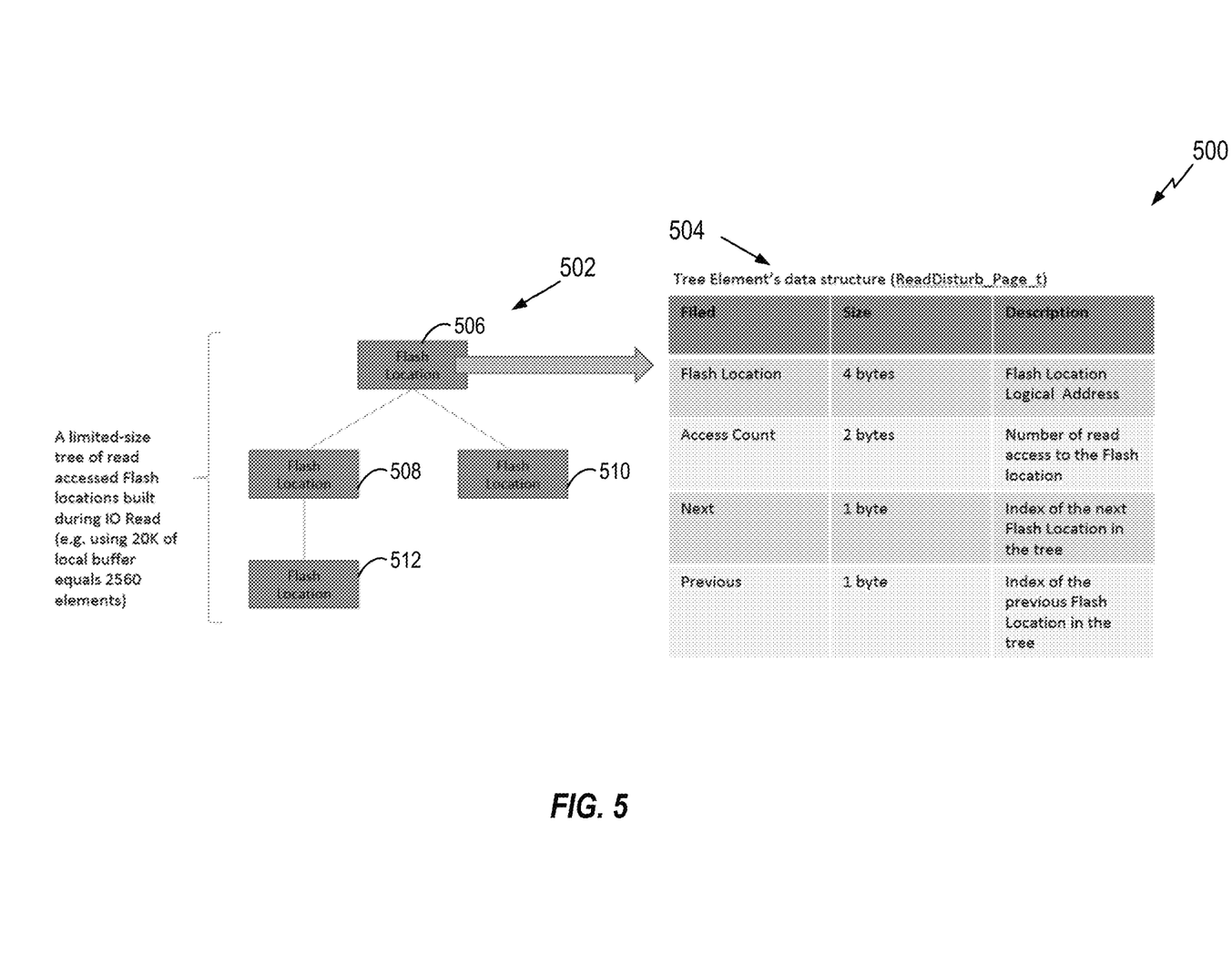
FIG. 5 illustrates an exemplary data structure including a Read Disturb tree structure and a corresponding table showing data stored in the Read Disturb tree for each element in the tree data structure.

Concerning a data structure that may be utilized in embodiments of the present disclosure for organizing a Read Disturb tree, FIG. 5 illustrates an exemplary data structure 500 including a tree structure 502 and a corresponding table 504 showing data stored in the Read Disturb tree for element in the tree data structure 502. The illustrated tree structure 502 includes a number of nodes or read accessed flash locations including nodes or flash locations 506, 508, 510, and 512. Each of these locations is a logical address that has been accessed rather than physical locations in the NVM.

The particular tree and number of nodes or locations shown in FIG. 5 is merely for purposes of illustration, and more locations may be contained in the tree data structure, as well as more or less branches in the data tree structure. In an aspect, the tree 502 is configured to include only those locations having been accessed a predetermined number of times. For example, locations 506, 508, 510, and 512 are those locations that have been accessed more than a predefined number of accesses, such as 100 accesses. The tree structure may be stored in a local memory, such as memory 110 in FIG. 1 as an example. By using a stored tree composed of flash locations (e.g., LBAs) that are accessed frequently (e.g., over 100 times), the controller/cache manager may quickly locate LBAs that are frequently accessed rather than searching the Read Disturb Table in the NVM 114, for example, to determine potential Read Disturb aggressors (i.e., those LBAs that more likely engender physical Read Disturb errors due to repeated high levels of access).

Of further note, the tree structure 502 and the number of locations within the tree may be limited in size to ensure that tree takes up only limited memory space in a local buffer or memory (e.g., memory 110) or the NVM itself in another alternative. For example, if the size is limited to 20,480 Kilobytes and 8 bytes are used for the data for each location, then 2560 locations or elements may be stored in the data tree 502.

Table 504 illustrates one example of data that may be stored for each location in the tree 502 within the Read Disturb tree. In the example shown, four fields may be used for each location entry; i.e., (1) the flash location, which is the LBA of a page or block, (2) the access count for that flash location, (3) an index of a next flash location in the tree, and (4) an index of a previous flash location in the tree. Exemplary sizes of these fields may be 4 bytes for the flash location, 2 bytes for the access count value, 1 byte for the next index, and 1 byte for the previous index. From this stored information, information about a particular LBA can be determined for determining if the potential exists for a Read Disturb issues for that LBA (and corresponding physical location) based on the access count, as well as next and previous locations accessed. According to another aspect, the tree 502 and associated data in Table 504 may reside in a local memory or cache, such as memory 110 in FIG. 1. This allows organization, sorting, and updating/eviction of the flash locations in the tree without move-in to the Read Disturb Table, which may be stored separately in the NVM 114 (or in the memory 110).

Figure 6:
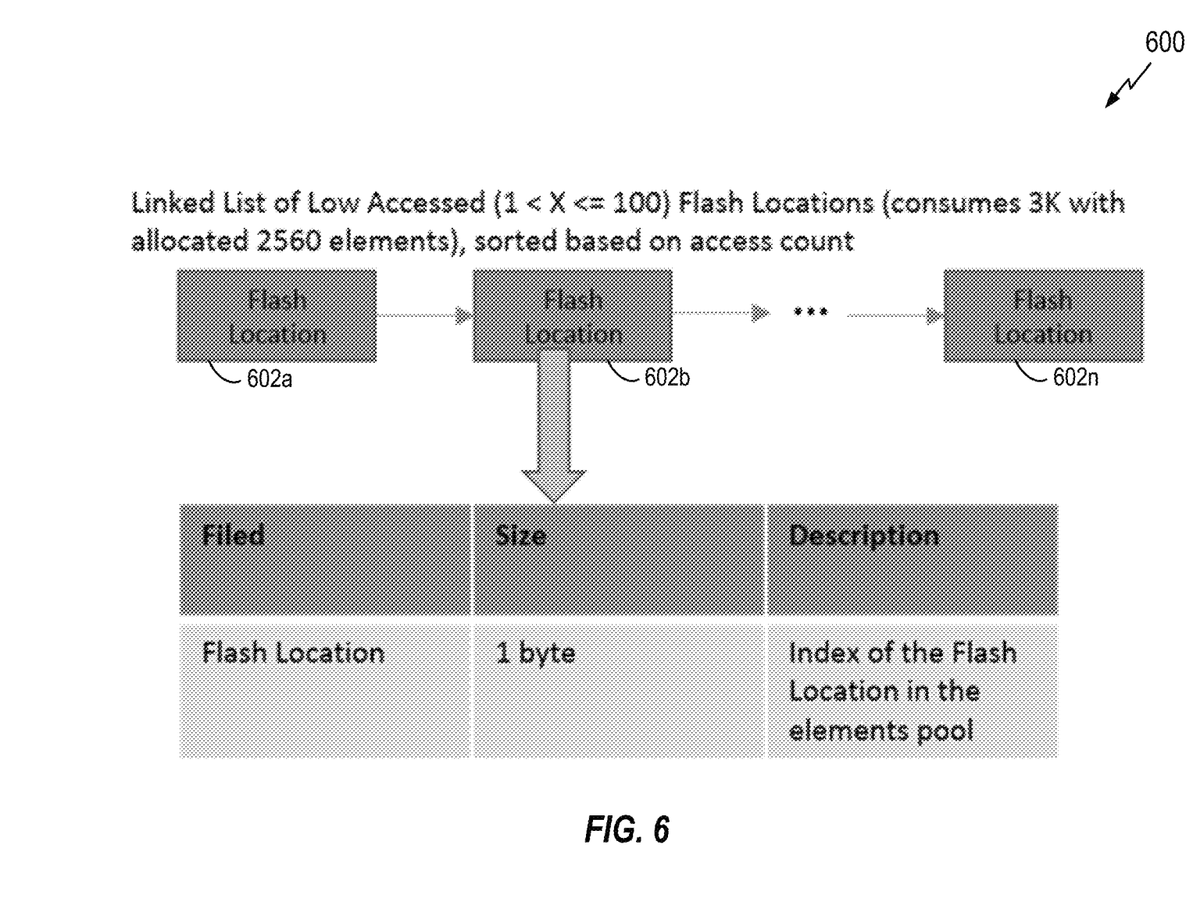
FIG. 6 illustrates an example of a list or table for storing low-access flash locations that may be utilized in the presently disclosed methods and apparatus.

In an aspect, those flash locations less frequently accessed may also be stored in another separate table or list (termed herein as a "Read Disturb Low Access List"). FIG. 6 illustrates an example table 600 for storing low-access flash locations. In this example, flash locations 602 accessed from between greater than 1 and 100 times are stored, but those skilled in the art will appreciate that other values and ranges may be selected. In particular, the stored flash locations 602a-602n may be composed as a linked list that is sorted based on the access count (e.g., sorted from locations with lowest number of accesses to locations with the highest number of accesses). Information stored for each flash location in the linked list may include a flash location field, which contains an index of the flash location in an elements pool of flash locations. In the example of FIG. 6, this index may be stored with a single byte. Further, the example shown in FIG. 6 may have an allocated 2560 elements, which consumes approximately 3 Kilobytes of storage space.

Figure 7:
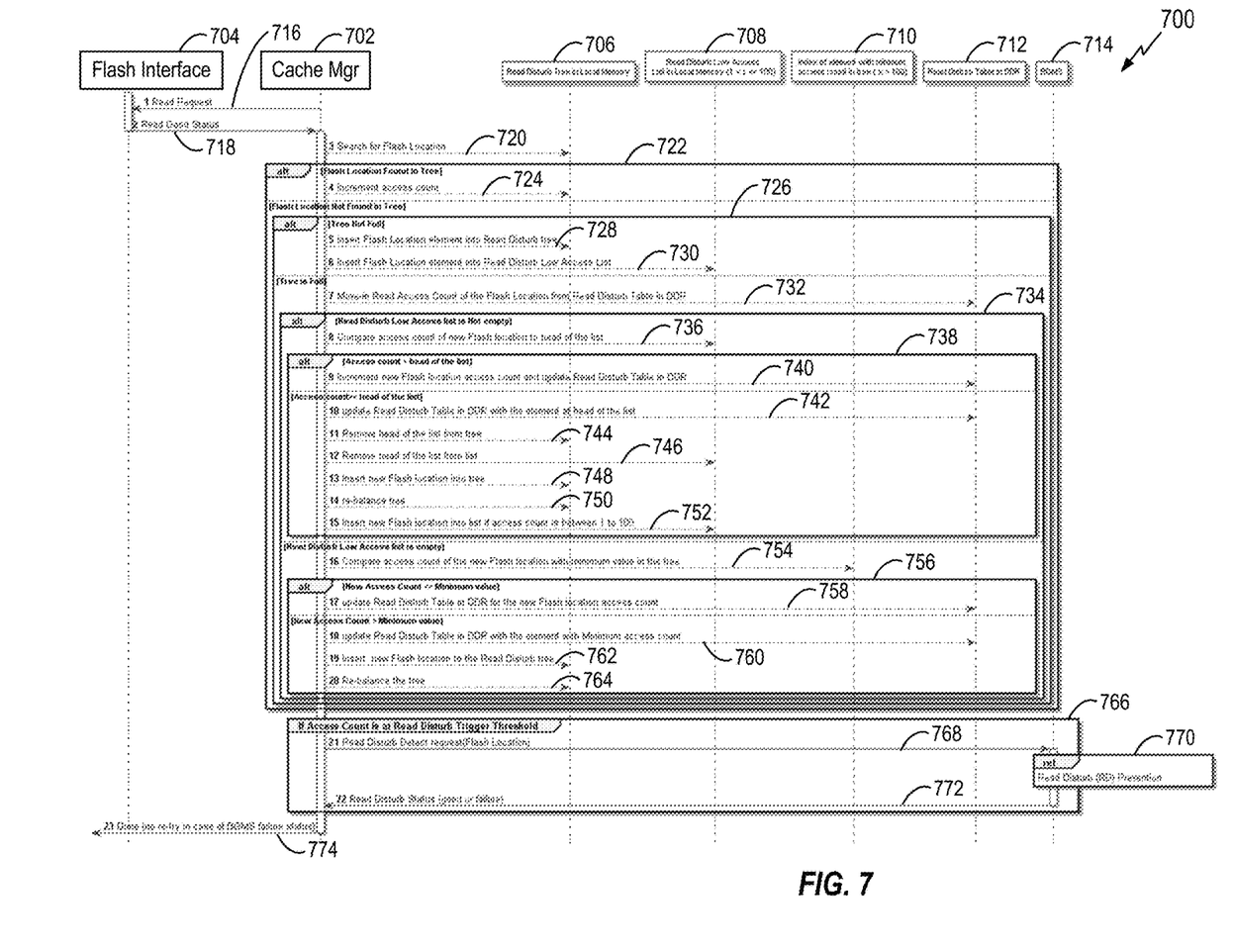
FIG. 7 illustrates a flow diagram of a Read Disturb triggering process according to a further aspect of the present disclosure accounting for LBAs rather than physical locations in an NVM.

FIG. 7 illustrates a flow diagram 700 of a Read Disturb triggering process according to a further aspect of the present disclosure accounting for LBAs rather than physical locations in an NVM, such as NVM 114. Diagram 700 illustrates messaging/signaling between a cache manager (CM) 702 (e.g., controller 108), a flash memory interface 704 (e.g., interface 112), a Read Disturb Tree 706 in a local memory, a Read Disturb Low Access list 708 (e.g., the list of FIG. 6), an index of elements 710 having a minimum access count warranting inclusion in the data tree structure, a Read Disturb Table 712 that is stored in memory, and a process 714 for effecting handling of a determination of Read Disturb (e.g., a background media scan (BGMS), which includes preventing read disturb errors and/or relocating pages or blocks to avoid read disturb errors. It is noted that the Read Disturb Table 712 may be stored in memory 110 of FIG. 1, but also could be stored in the NVM 114 as an alternative.

When a host initiates a read request via the CM 702, request signaling is sent to the flash interface 704 as shown at 716 to access the NVM (e.g., NVM 114 in FIG. 1). If the data read from the NVM 114 is good, a read good status message 718 is sent from the interface 704 to the CM 702. The CM 702 then searches for the read flash location in the Read Disturb Tree 706 as indicated by message 720 to determine if the location has been previously accessed. If the location is found in the Read Disturb Tree 706 (as indicated by execution block 722), then an access count corresponding to the same logical location or set of locations is incremented by the CM 702 in the read Disturb Tree 706 as indicated by message 724.

In the event that the read flash location is not found in the tree 706 and the tree is not full (See e.g., block 726 indicating continued operation if the tree is not full), the flash location element is inserted into the Read Disturb tree as indicated by message 728. Additionally, the flash location element may be inserted by the CM 702 into the Read Disturb Low Access List 708 as indicated by message 730. In the alternative, if the tree is indeed full then the Read Access count of the read flash location is moved-in at the Read Disturb table 712 as may been seen by message 732.

Furthermore, if the Read Disturb Low Access List 708 in not empty, even though the tree is full as indicated at block 734, the CM 702 effectuates a comparison of the access count of the new Flash location to the head of the list as indicated by message or process 736. As indicated in block 738, if the access count is less than the access count of the location at the head of the list, which is the location with the largest number of read access for low access list, the new Flash location access count is incremented and the CM 702 updates the Read Disturb table 712 with the incremented access count value as shown by message 740.

If, on the other hand, the access count of the Flash location is greater than or equal to the head of the Read Disturb Low Access List 708, the CM 702 updates the Read Disturb table 712 with the element at the head of list as indicated by message 742. Additional actions taken after determining that the access count of the read Flash location is greater than or equal to the head of the list include the CM 702 removing the head of the list or tree from Read Disturb Low Access List 708 as shown by message 744. Additionally, the head of the list to be inserted into the tree is removed or evicted by the CM 702 from the Read Disturb Low Access List 708 as indicated by message 746. Still further the CM 702 inserts that new Flash location into the tree (See message 748) and also rebalances the tree (See message 750), Yet further, the new Flash location is inserted by the CM 702 into the Read Disturb Low Access List 708 is the access count is between 1 to 100 as shown by message 752.

Should the Read Disturb Low Access List 708 be empty, then the Cm 702 compares the access count of the new Flash location with a minimum value in the tree from the index of the elements with minimum access count in the tree 710 as indicated with message 754. If the new access count is less than or equal to the minimum value for the tree as indicated in block 756, the CM 702 updates the Read Disturb Table 712 for the new Flash location access count as shown by message 758. On the other hand in block 756, if the new access count is greater than the minimum value, the CM 702 updates the Read Disturb Table with the new Flash location exceeding the minimum count value as shown at message 760. Furthermore, the CM 702 inserts the new Flash location into the Read Disturb tree 706 as shown by message 762 and the tree is rebalanced by the CM 702 due to the insertion (See message 764).

After the sorting or grouping accomplished by the previous processes using the data structure tree 706 and Read Disturb Low Access List 708, if the access count is determined by the CM 702 to be at a predefined Read Disturb Trigger Threshold as shown by block 766, the Cm 702 issues a Read Disturb Detect request 768 for the flash location to a read disturb prevention process 770 effected by BGMS 714 or some other methodology for mitigating Read Disturb effects. The process 770 then provides the CM 702 with a Read Disturb Status indicating either a good read status or a read failure for those potentially affected nearby pages (or blocks) as indicated by message 772. The completion of the process is communicated to the interface 304 by the CM 302 as indicated by message 774, whether the status was good or a failure. In the case of a failure, in an aspect the processes of FIG. 7 are not repeated in the case of the failure of the Read Disturb prevention 770. It is noted here that the methods for mitigation of Read Disturb can vary and any number of different methods may be used with the presently disclosed methods for triggering. Nonetheless, it is also noted that a robust solution would be to direct all highly accessed LBAs to the same NAND physical block or group of blocks. This would have a noticeable advantage of reducing Write Amplification because substantially fewer blocks are relocated. It has the added bonus of resetting the effect of Read Disturbs in a single instance for common highly accessed LBAs.

According to further aspects, the methods disclosed herein may include a mechanism to detect if a host pattern is totally random access or not (or in an alternative if the host is using an access pattern that may have a trend but varies too much for the NVM to be able to optimize and predict). In particular, the method could further include counting the number of evictions from the Read Disturb low access list 708 that occur per unit of time, such as per each second If the number of evictions is more than a predefined threshold (e.g. the Number of Read Disturb Tree elements), the NVM would not be updated, and the update could be skipped each second where the eviction is above the threshold and would not resume until the eviction rate drops below a second threshold (e.g. ⅓ of Number of Read Disturb Tree elements), where a second threshold is used as a type of hysteresis to ensure that the eviction rate is low enough to indicate non-random access. In this manner, random access events can be detected.

As will be appreciated by those skilled in the art, the processes illustrated in FIG. 7 effect a sorting and grouping of Flash location accesses from the logical or host domain side, which allow for the creation of a rough matrix grouping into a higher risk pool of addresses and lesser risk pool of addresses. From this identification, the present methods afford a benefit of triggering the Read Disturb prevention process (e.g., BGMS) well before significant and deleterious Read Disturb problems arise in the NVM through the use of the low access list allowing for "medium" host pattern detection (i.e., less significant host access patterns which still present a risk of Read Disturb issues). Furthermore, the present methods do not require a change in the extant Read Disturb prevention processes already used in SSD devices.

Figure 8:
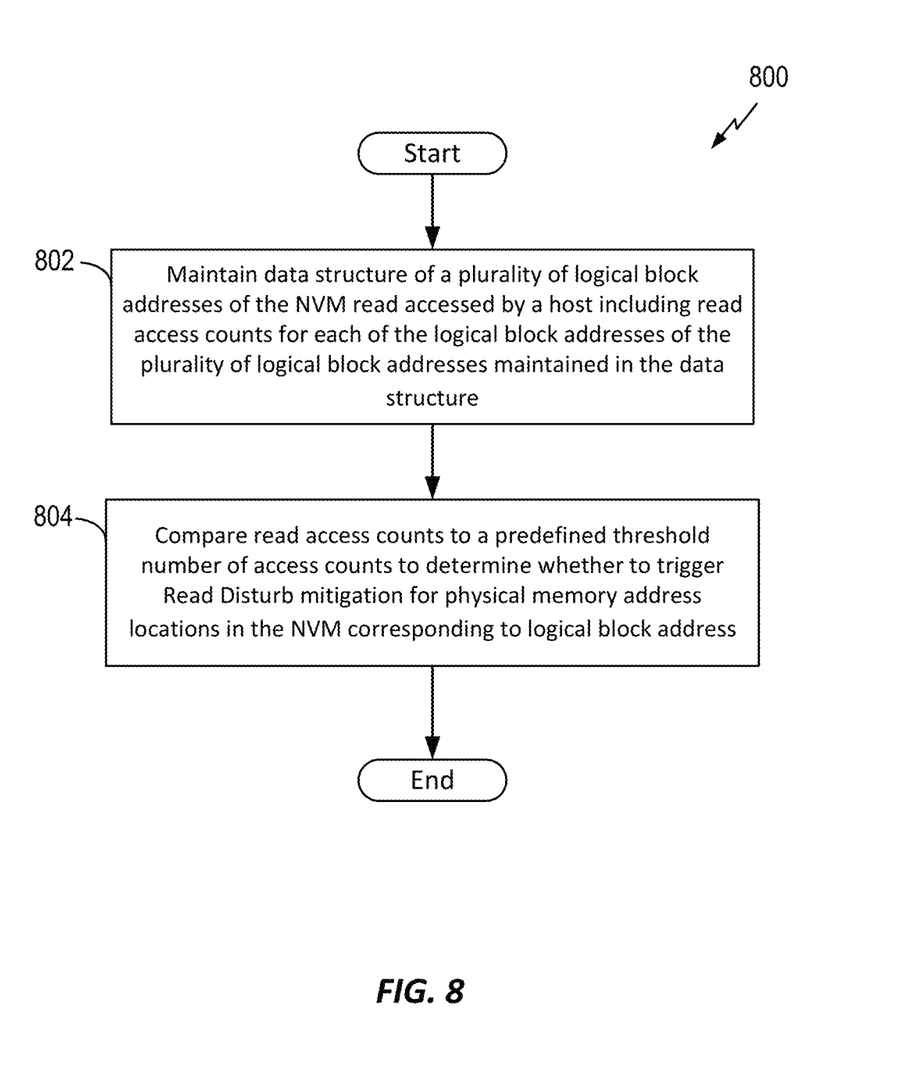
FIG. 8 is a flow chart illustrating an exemplary method for monitoring Read Disturb in a device such as an NVM device.

FIG. 8 is a flow chart illustrating an exemplary method or process 800 for monitoring Read Disturb in a device such as an NVM device. The method includes maintaining a data structure of a plurality of logical block addresses of the NVM read accessed by a host including read access counts for each of the logical block addresses of the plurality of logical block addresses maintained in the data structure as shown in block 802. This process in block 802 may be implemented with controller 108, as one example, and may further include the tree data structure as illustrated in FIG. 5, for example.

Method 800 further includes comparing the read access counts to a predefined threshold number of access counts to determine whether to trigger Read Disturb mitigation or prevention processes for physical memory address locations in the NVM corresponding to logical block address as shown in block 804. As discussed before, the predefined threshold number may be trigger threshold such as 4000 read accesses, but is certainly not limited to such. Additionally, the Read Disturb mitigation or prevention processes may include relocation of pages or blocks in the NVM to a different physical memory address in the NVM, and also my include BGMS processes as well.

According to a further aspect, the method 800 may further include maintaining the data structure of the plurality of logical block addresses by including only logical block addresses in the data structure that have a read access count greater than a predefined minimum number of accesses, such as 100 in the previous examples, although not limited to such. In still a further aspect, the method 800 may include the data structure configured as a data tree structure wherein each node in the tree represents a logical memory location accessed by the host, and each node includes data including one or more of the logical block address, the access counts of the logical block address, an index of a next logical block address location in the data tree structure, and an index of previous logical block address location in the data tree structure.

In yet another aspect, method 800 may include storing the data structure in a local memory of a solid state drive (SSD) including the NVM, with the local memory coupled to a controller configured to control accesses to the NVM. According to yet another aspect, method 800 may include updating a Read Disturb table stored in the NVM with access count values of physical memory locations corresponding to the logical block addresses maintained in the data structure. In one aspect, the access count may simple be a global value where the physical and logical access counts are the same, but more complex counts using separate access counts for both the physical memory location and logical block addresses are also contemplated.

In yet another aspect, method 800 may include maintaining a low access list of logical block addresses accessed by the host within a range of access counts, wherein a maximum of the range is less than a predefined minimum number of accesses required for inclusion of a logical block address in the data structure. Still further, method 800 may include updating a Read Disturb table stored in the NVM with access count values of physical memory locations corresponding to the logical block addresses maintained in the low access list of logical block addresses.

In another aspect, the present disclosure may contemplates another apparatus for mitigating Read Disturb errors in a non-volatile memory (NVM), the apparatus including means for determining which logical block addresses (LBAs) in the NVM (e.g., 114) are frequently accessed by a host (e.g., 102). The means for determining may be implemented by structure such as controller 108 in FIG. 1 in one example, where the controller is configured for keeping track of LBAs and their access by the controller 108 via direction from the host 102 and host interface 106. In another example, this means could be implemented with controller 108 in combination with one or more of memory 110, the NVM 114, and even host 102. It is noted that the means for determining may also be implemented with other controllers or processors apart from controller 108, or any equivalents thereof. Furthermore, the apparatus for mitigating Read Disturb errors includes means for triggering a Read Disturb prevention process when one or more of the frequently accessed LBAs exceed a predefined number of accesses, as determined by the means for determining. The means for triggering may be implemented by structure such as controller 108 in FIG. 1 in one example, where the controller is configured for trigger the Read Disturb Prevention process and/or call other devices such as host 102 to initiate the Read Disturb prevention process. In another example, this means for triggering could be implemented with controller 108 in combination with one or more of memory 110, the NVM 114, and host 102. It is noted that the means for triggering may also be implemented with other controllers or processors apart from controller 108, or any equivalents thereof.

As will be appreciated by those skilled in the art, the disclosed methods and apparatus afford improved Read Disturb detection by taking into consideration the logical or host access patterns over the conventional keeping of physical memory page read counts for every single page. This is particularly important in VRI (Very Read Intensive) drives, and also as long-term usage of SSDs using NVM gives rise to increasing Read Disturb issues. Furthermore, the write amplification is significantly reduced by the presently disclosed methods and apparatus.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

What is claimed is:

1. A method of monitoring a non-volatile memory (NVM) for potential Read Disturb errors, the method comprising:
maintaining a data structure of a plurality of logical block addresses respectively corresponding to physical memory address locations of the NVM, wherein the data structure further includes read access counts corresponding to a number of times the plurality of logical block addresses has been read accessed by a host, and wherein adjacent logical block addresses correspond to at least some non-adjacent physical memory address locations in the NVM; and
comparing the read access counts of the plurality of logical block addresses to a predefined threshold number of access counts to determine whether to trigger a Read Disturb mitigation for the physical memory address locations of the NVM corresponding to the plurality of logical block addresses.

2. The method of claim 1, wherein maintaining the data structure of the plurality of logical block addresses further comprises including only logical block addresses in the data structure that have a read access count greater than a predefined minimum number of accesses.

3. The method of claim 1, wherein the data structure is configured as a data tree structure wherein each node in the tree represents a logical memory location accessed by the host, and each node includes data including one or more of a logical block address, an access count of the logical block address, an index of a next logical block address location in the data tree structure, and an index of a previous logical block address location in the data tree structure.

4. The method of claim 1, wherein the data structure is stored in a local memory of a solid state drive (SSD) including the NVM, and the local memory is coupled to a controller configured to control accesses to the NVM.

5. The method of claim 1, further comprising:
updating a Read Disturb table stored in the NVM with access count values of physical memory locations corresponding to the plurality of logical block addresses maintained in the data structure.

6. The method of claim 1, further comprising:
maintaining a low access list of logical block addresses accessed by the host within a range of access counts, wherein a maximum of the range is less than a predefined minimum number of accesses required for inclusion of a logical block address in the data structure.

7. The method of claim 6, further comprising:
updating a Read Disturb table stored in the NVM with access count values of physical memory locations corresponding to the logical block addresses maintained in the low access list of logical block addresses.

8. The method of claim 1, further comprising performing Read Disturb mitigation for the physical memory address locations of the NVM corresponding to the plurality of logical block addresses based on the comparison of the read access counts to the predefined threshold number of access counts.

9. The method of claim 1, further comprising:
detecting a trend in a host access pattern based on the data structure;
determining whether to trigger the Read Disturb mitigation based on the detected trend in the host access pattern; and
performing the Read Disturb mitigation based on the detected trend.

10. The method of claim 1, further comprising performing the Read Disturb mitigation by directing logical block addresses having read access counts exceeding the threshold number to a same physical block of the NVM.

11. A solid state drive (SSD) comprising:
a non-volatile memory (NVM); and
a controller communicatively coupled to a host device, a local memory device, and the NVM,
wherein the controller is configured to:
store read access counts in the local memory device, wherein the read access counts correspond to a number of times logical block addresses are read accessed by the host device, wherein the logical block addresses respectively correspond to physical memory address locations of the NVM, and wherein adjacent logical block addresses correspond to at least some non-adjacent physical memory address locations in the NVM;
determine when one or more of the stored read access counts of the logical block addresses exceed a predefined threshold number of access counts; and
trigger a Read Disturb prevention process for physical memory address locations in the NVM corresponding to a logical block address having corresponding read access counts determined to exceed the predefined threshold number of access counts.

12. The solid state drive of claim 11, wherein the controller is further configured to:
store the read access counts in a tree data structure having a plurality of nodes each corresponding to a respective logical block address.

13. The solid state drive of claim 12, wherein the controller is further configured to:
store only logical block addresses in the data structure having a read access count greater than a predefined minimum number of accesses.

14. The solid state drive of claim 11, wherein the controller is further configured to:
update a Read Disturb table stored in the NVM with the stored access count values.

15. The solid state drive of claim 11, wherein the controller is further configured to:
update a Read Disturb table stored in the NVM with access count values of the physical memory locations corresponding to the logical block addresses stored in the local memory.

16. The solid state drive of claim 11, wherein the controller is further configured to:
store a low access list of logical block addresses in the local memory device, wherein the low access list comprises logical block addresses in the NVM accessed by the host device within a range of access counts, wherein a maximum of the range is less than a predefined minimum number of accesses required for inclusion of a logical block address in the data structure.

17. The SSD of claim 11, wherein the controller is further configured to sort and group of NVM read access accesses into a matrix that groups the accesses into a higher risk pool of addresses and a lesser risk pool of addresses.

18. The SSD of claim 11, wherein the controller is further configured to:

detect a trend in a host access pattern based on the data structure;
determine whether to trigger the Read Disturb mitigation based on the detected trend in the host access pattern; and
perform the Read Disturb mitigation based on the detected trend.

19. The SSD of claim 12, wherein the controller is further configured to perform the Read Disturb mitigation to relocate pages within the NVM based on the tree data structure to reduce write amplification.

20. An apparatus for mitigating Read Disturb errors in a non-volatile memory (NVM), the apparatus comprising:
means for determining which logical block addresses (LBAs) of a host are frequently accessed by the host, wherein the LBAs respectively correspond to physical memory address locations of the NVM, wherein adjacent LBAs correspond to at least some non-adjacent physical memory address locations in the NVM, and wherein the means for determining further comprises means for determining a number of times the LBAs have been read accessed by the host; and
means for triggering a Read Disturb prevention process when a read access count of one or more of the LBAs exceeds a predefined number of accesses.

21. The apparatus of claim 20, further comprising:
means for maintaining the LBAs in the NVM that are frequently accessed by the host in a data structure of a plurality of logical block addresses of the NVM where the data structure further includes read access counts for each of the logical block addresses of the plurality of logical block addresses maintained in the data structure.

* * * * *